United States Patent [19]

Ishida

[11] Patent Number: 5,213,658

[45] Date of Patent: May 25, 1993

[54] PLASMA PROCESSING METHOD

[75] Inventor: Tomoaki Ishida, Itami, Japan

[73] Assignee: Mitsubishi Denki Kabushiki Kaisha, Tokyo, Japan

[21] Appl. No.: 644,625

[22] Filed: Jan. 23, 1991

[30] Foreign Application Priority Data

Oct. 26, 1990 [JP] Japan .................. 2-287330

[51] Int. Cl.⁵ ............................................ H01L 21/00
[52] U.S. Cl. .................... 156/643; 156/345; 118/723; 427/571
[58] Field of Search ............. 156/643, 345, 652; 204/298.31, 192.12, 192.32, 298.02; 427/39; 118/723

[56] References Cited

U.S. PATENT DOCUMENTS

| 4,350,578 | 9/1982 | Frieser et al. | 204/298.31 |
| 4,351,805 | 9/1982 | Reisman et al. | 118/729 |
| 4,793,975 | 12/1988 | Drage | 156/345 |

FOREIGN PATENT DOCUMENTS

| 0132538 | 2/1985 | European Pat. Off. |
| 0273741 | 7/1988 | European Pat. Off. |
| 58-017018 | 2/1983 | Japan |
| 60-001952 | 1/1985 | Japan |
| 60-062460 | 4/1985 | Japan |
| 61-087884 | 5/1986 | Japan |
| 62-057214 | 3/1987 | Japan |
| 1-107539 | 4/1989 | Japan |
| 1-140725 | 6/1989 | Japan |
| 1-184839 | 7/1989 | Japan |
| 1-189910 | 7/1989 | Japan |
| 2-011781 | 1/1990 | Japan |

Primary Examiner—Brian E. Hearn
Assistant Examiner—George Gondreau
Attorney, Agent, or Firm—Leydig, Voit & Mayer

[57] ABSTRACT

In a plasma processing method and a plasma processing apparatus, plasma is processed by floating a focus ring by the repulsion between a magnet mounted in the focus ring and another electromagnet and adjusting the height of the focus ring to an optimal height by the current flowing to the electromagnet. Therefore, it is possible to set an optimal height of the focus ring for each layer in the laminated film etching, to enhance the uniformity of the laminated film etching, and to achieve a precise etching.

3 Claims, 4 Drawing Sheets

PLASMA PROCESSING METHOD

BACKGROUND OF THE INVENTION

1. Field of the Invention

The present invention relates to a plasma processing method and a plasma processing apparatus, and more particularly to a plasma processing method and a plasma processing apparatus for use in production processes for a semiconductor device, in particular, in an etching process.

2. Description of the Related Art

At present, in a production process of a semiconductor device, plasma etching and reactive ion etching (RIE), which use a plasma of a reactive gas, are widely used in an etching process to form a fine wiring pattern in the submicron line width region.

FIG. 4 is a schematic sectional side view of a conventional reactive ion etching apparatus. Referring to FIG. 4, high-frequency electrodes 3 and 4 opposite to each other are disposed in a processing container 7. A coupling condenser 8 is inserted between the electrodes 3 and 4 and connected to a high-frequency power supply 9 which supplies high-frequency electric power. A reactive gas inlet 5 and a reactive outlet 6 for introducing and exhausting reactive gas therethrough respectively are mounted in the processing container 7. A substrate 1 to be processed is laid on the high-frequency electrode 3, and furthermore, what is called a focus ring 2, which is a cylindrical insulator, is placed to surround the substrate 1.

The focus ring 2 functions to enhance the uniformity of progress of the etching reaction on the surface of the substrate 1. In general, the progress of the etching reaction is slower at the center portion of the substrate 1 than at the peripheral portion thereof. This is because etching reaction seeds at the center portion of the substrate 1 are depleted due to the etching reaction and this phenomenon is called the internal loading effect. The focus ring 2 functions to decrease the progress and speed of the etching reaction at the peripheral portion of the substrate 1, thereby achieving an excellent etching uniformity on the substrate 1.

It is thought that the etching speed is lowered at the peripheral portion of the substrate 1 by the focus ring 2 since the solid angle of incidence of the reaction ions onto the substrate 1 is restricted by the focus ring 2 as the reaction ions are incident nearer the peripheral portion of the substrate 2, than the center or by obstruction of the supply of neutral radical molecules contributing to the reaction reactive ion the focus ring 2 in the same manner as in the case of the reactive ion. This reveals that the higher the focus ring 2 is, the lower the reactivity at the peripheral portion of the substrate 1 becomes. Therefore, the height of the focus ring 2 is an important parameter for obtaining excellent etching characteristics.

The conventional plasma processing apparatus is composed as described above and maintains a predetermined pressure in the processing container 7 by introducing a reactive gas, for example, $CF_4$, $CHF_3$, $Cl_2$ or $HCl$, into the processing container 7 through the gas inlet 5 and simultaneously exhausting the gas in the processing container 7 through the outlet 6. By applying high-frequency voltage from the high-frequency power supply 9 between the high-frequency electrodes 3 and 4 in this state, a plasma in the reactive gas is generated between the high-frequency electrodes 3 and 4. At this time, the high-frequency electrode 3 on which the substrate 1 is laid is biased with a negative potential. Therefore, a region, called a sheath, having a strong electric field is generated between the plasma region and the high-frequency electrode 3. The speed of the reactive gas generated in the plasma is increased by the electric field in the sheath and the reactive gas is incident on the high-frequency electrode 3 and the substrate 1 laid on the high-frequency electrode 3. As a result, a thin film of, for example, polysilicon, is etched by the reaction of the incident ions.

Since the height of the focus ring 2 is an important parameter for controlling the uniformity of etching in the above-described plasma processing apparatus, it is necessary to finely adjust the height in accordance with process conditions such as the kind of film to be etched, the reactive gas to be used and the amount of high-frequency electric power. Furthermore, the recent high density integration of semiconductor devices requires uniform etching of a laminated film formed by laminating two different thin films (for example, a tungsten silicide/polysilicon laminated film or an aluminum alloy/titanium nitride laminated film).

However, since the focus ring 2 in the conventional plasma etching apparatus is fixed to the high-frequency electric supply 3 and the height thereof is constant, it is difficult to simultaneously obtain excellent etching characteristics of various kinds of thin films by using a focus ring 2 having a single height. Therefore, it is difficult to uniformly etch a laminated film with a single plasma processing apparatus.

SUMMARY OF THE INVENTION

Accordingly, an object of the present invention is to provide a plasma processing method and a plasma processing apparatus which uniformly etch a laminated film with a single apparatus and obtain an excellent yield and electrical characteristics of a semiconductor device formed.

In order to achieve the above object, according to one aspect of the present invention, there is provided a plasma processing method which comprises the steps of: placing a substrate to be processed on a high-frequency electrode disposed in a processing container; exhausting gas in the processing container and introducing reactive gas into the processing container; and levitating a focus ring surrounding the substrate to be processed and having a magnet therein with the magnetic field of another magnet to a predetermined height while a plasma is generated by applying high-frequency electric power to the high-frequency electrode so as to process the substrate.

According to another aspect of the present invention, there is provided a plasma processing apparatus which comprises: a processing container having a reactive gas inlet and a reactive gas outlet; a high-frequency electrode disposed in the processing container; a high-frequency power supply connected to the high-frequency electrode; a substrate to be processed placed on the high-frequency electrode; magnetic field generating means for generating a magnetic field in the processing container; and a focus ring disposed surrounding the substrate and including a magnet for levitation to a predetermined height above the high-frequency electrode by a magnetic field generated by the magnetic field generating means.

DESCRIPTION OF THE PREFERRED EMBODIMENTS

Figure 1:
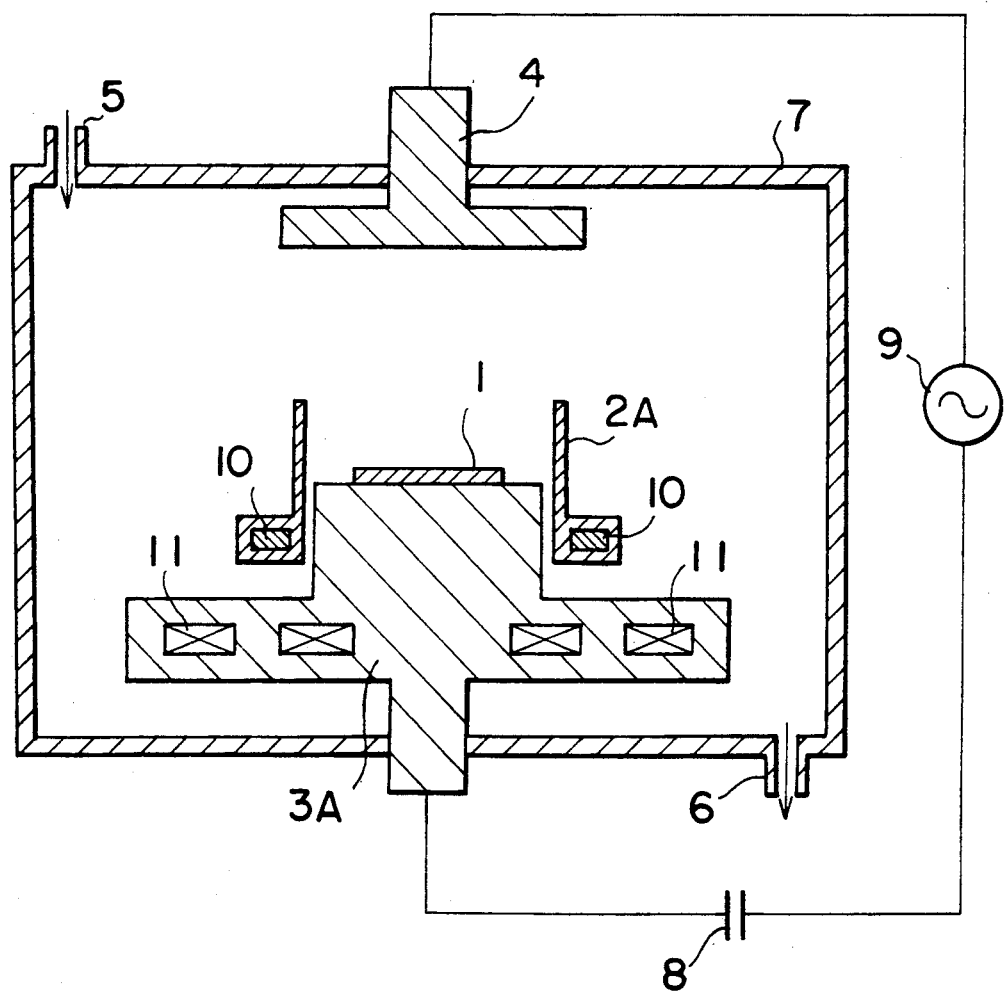
FIG. 1 is a schematic sectional view of a plasma processing apparatus according to an embodiment of the present invention.

FIG. 1 is a sectional view of a plasma processing apparatus according to an embodiment of the present invention. Numerals 1 and 4 to 9 denote the same components as those in the above-described conventional plasma processing apparatus. In the present invention, permanent magnets 10 are embedded in a focus ring 2A and electromagnets 11 are buried in a high-frequency electrode 3A.

In the plasma processing apparatus having the above composition, a substrate 1 to be processed, on which a laminated film to be etched and a resist pattern are previously formed, is placed on the high-frequency electrode 3A. Then, when the electric current is applied to the electromagnets 11, the electromagnets 11 and the permanent magnets 10 buried in the focus ring 2A repel each other and the focus ring 2A is levitated by the magnetic field and is stationary. At this time, the amount of electric current flowing through the electromagnets 11 is set so that the height of the focus ring 2A is suitable for obtaining the best uniformity when the uppermost layer of the laminated film (now shown) formed on the substrate 1 is etched.

Subsequently, a predetermined pressure in the processing container 7 is maintained by introducing reactive gas, for example, or CF$_4$, CHF$_3$, Cl$_2$ or HCl, from the gas inlet 5 and simultaneously exhausting the reactive gas from the outlet 6. By applying the high-frequency voltage from the high-frequency power supply 9 between the high-frequency electrodes 3 and 4 in this state a plasma of the reactive gas is generated between the high-frequency electrodes 3 and 4. The uppermost layer of the laminated film is etched in this state. When the etching of the uppermost layer is completed, the high-frequency power supply 9 is turned off, the supply of the reactive gas from the gas inlet 5 is simultaneously stopped so as to stop the etching reaction, and the gas in the processing container 7 is exhausted for a time.

Then, the second layer is etched. In this case it is also necessary only to repeat the above operations. In other words, the value of current flowing to the electromagnet 11 is adjusted, the focus ring 2A is floated to a position suitable for obtaining the best etching uniformity for the material of the second layer, the reactive gas is introduced into the processing container 7, and the high-frequency electric power is applied between the high-frequency electrodes 3A and 4, so that plasma of the reactive gas is generated. When the etching of the second layer is completed, the etching reaction is stopped by the same operations as in the case of the uppermost layer. If the laminated film has more than two layers, uniform etching is performed for each layer of the laminated film by repeating the above operations a number of times corresponding to the number of layers of the laminated film.

Figure 2:
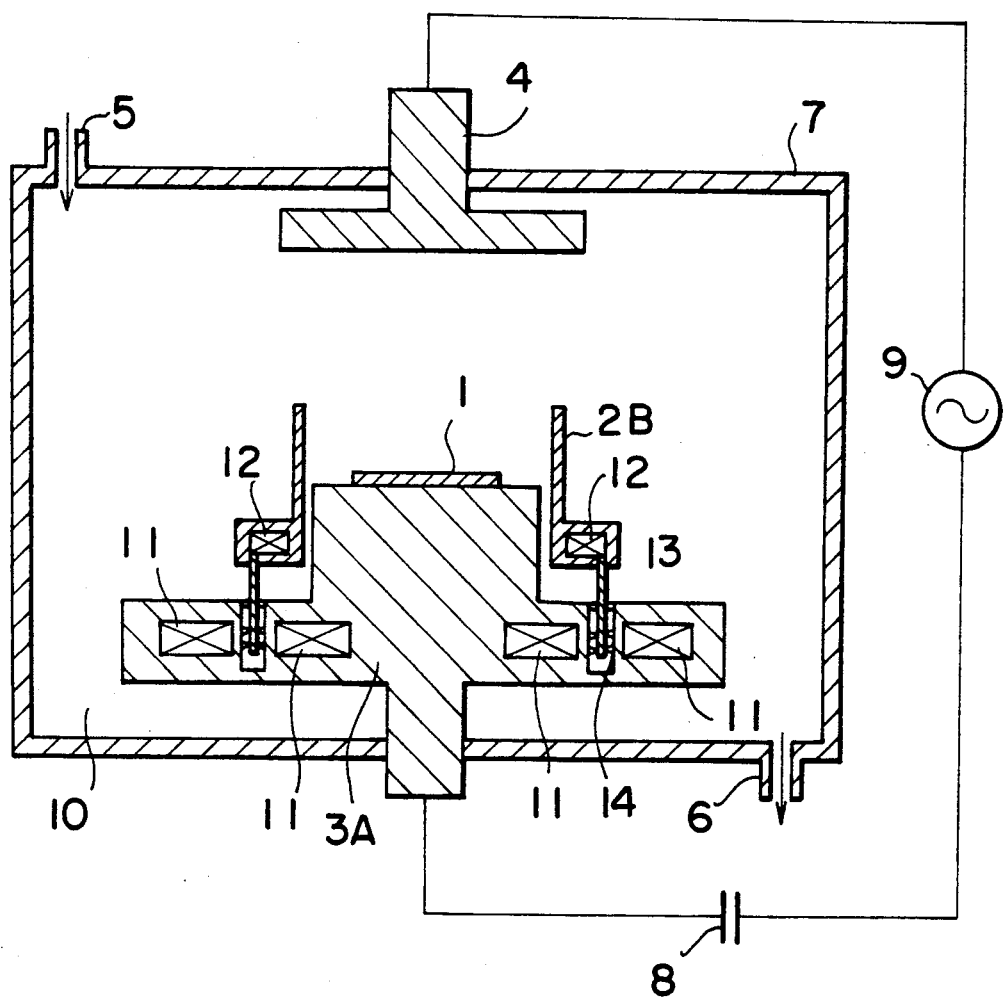
FIGS. 2 and 3 are schematic sectional views of plasma processing apparatuses according to other embodiments of the present invention.
Figure 3:
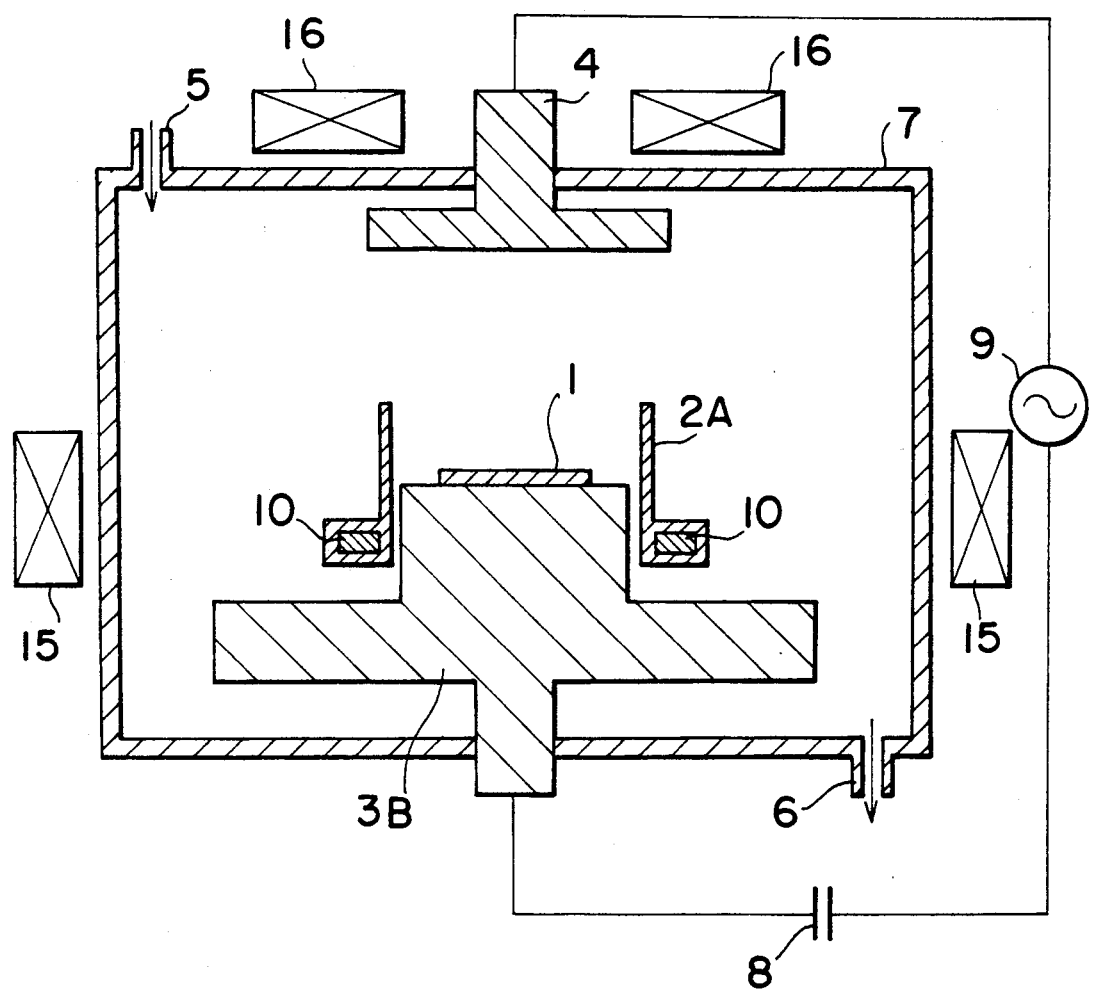
Figure 4:
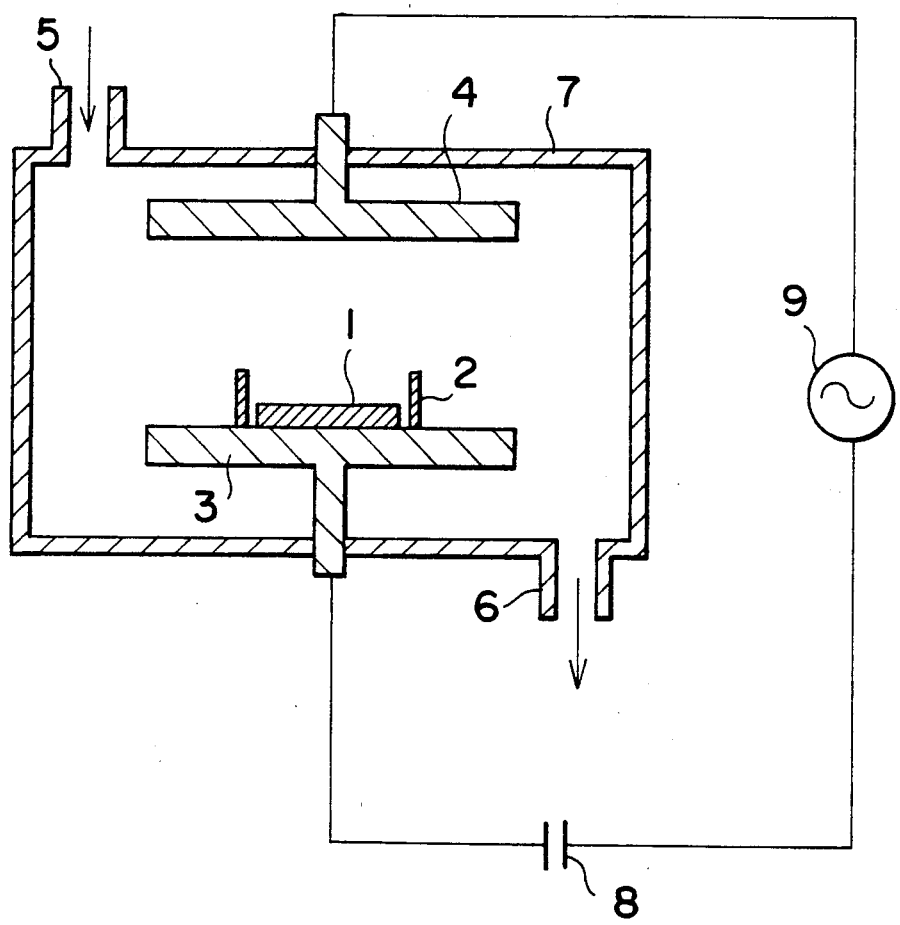
FIG. 4 is a schematic sectional view of a conventional plasma processing apparatus.

Although the permanent magnets 10 are embedded in the focus ring 2A in the above embodiment, electromagnets 12 may be embedded in a focus ring 2B as shown in FIG. 2. In this case, the electric power may be supplied to the electromagnets 12 by pins 13 or the like through electric contacts 14 mounted in the high-frequency electrode 3A. Furthermore, although the electromagnets 11 are embedded in the high-frequency electrode 3A in the above embodiment, as shown in FIG. 3, electromagnets 15 may be disposed on both sides of the processing container 7, or electromagnets 16 may be disposed above the processing container 7. These magnets may be disposed in any position and have the same effects as those in the above embodiment.

Furthermore, although the plasma etching for a laminated film is described in the above embodiment, it is natural that the present invention be applied to the etching of a single film or multistep etching. In order to obtain optimal etching conditions, the height of the focus ring 2A may be adjusted during the etching operation itself.

What is claimed is:

1. A plasma processing method comprising:
    placing a substrate to be processed on a high frequency electrode disposed in a processing container;
    exhausting gas from said processing container and introducing reactive gas into said processing container;
    generating a plasma in said processing container by applying high frequency electric power to said high frequency electrode, thereby processing the substrate; and
    while generating a plasma, levitating a focus ring having a magnet therein and surrounding the substrate to a predetermined height above the high frequency electrode with a magnetic field produced by another magnet.

2. A plasma processing method according to claim 1 including processing said substrate by etching a laminated film comprising a plurality of layers and disposed on said substrate and adjusting the height of said focus ring during etching of each of said layers.

3. A plasma processing method according to claim 1 including processing said substrate by etching a single layer film disposed on said substrate in more than one etching step.

* * * * *